United States Patent [19]

Bitting et al.

[11] 4,423,442

[45] Dec. 27, 1983

[54] TAPE RECORDER UTILIZING AN INTEGRATED CIRCUIT

[75] Inventors: Ricky F. Bitting, N. Syracuse; Roland M. Marion, Lafayette, both of N.Y.

[73] Assignee: General Electric Company, Syracuse, N.Y.

[21] Appl. No.: 336,326

[22] Filed: Dec. 31, 1981

[51] Int. Cl.³ ............................................. G11B 5/02
[52] U.S. Cl. ..................................................... 360/68
[58] Field of Search ................... 360/67, 68; 330/260, 330/290, 293

[56] References Cited

U.S. PATENT DOCUMENTS 4,342,006 7/1982 Ishigaki ................................ 360/68

*Primary Examiner*—Vincent P. Canney

*Attorney, Agent, or Firm*—Richard V. Lang; Carl W. Baker

[57] ABSTRACT

A tape recorder is described which is substantially fully integrated and which performs the required functions of a tape recorder in either the recording or playback mode. The tape recorder is readily converted from the record to the play mode of operation by simple switching means which operate to control selected current sources on the integrated circuit to activate or inactivate the functional blocks of the integrated circuit involved in the selected mode of operation. By the use of a temperature compensated reference in the emitter path of a differentially connected transistor pair to stabilize the current in two current mirrors not simultaneously operated, one may stabilize current sources associated with either mirror. The arrangement thus permits a highly economical method of mode control while at the same time preserving high temperature stability in all of the controlled functional elements.

21 Claims, 5 Drawing Figures

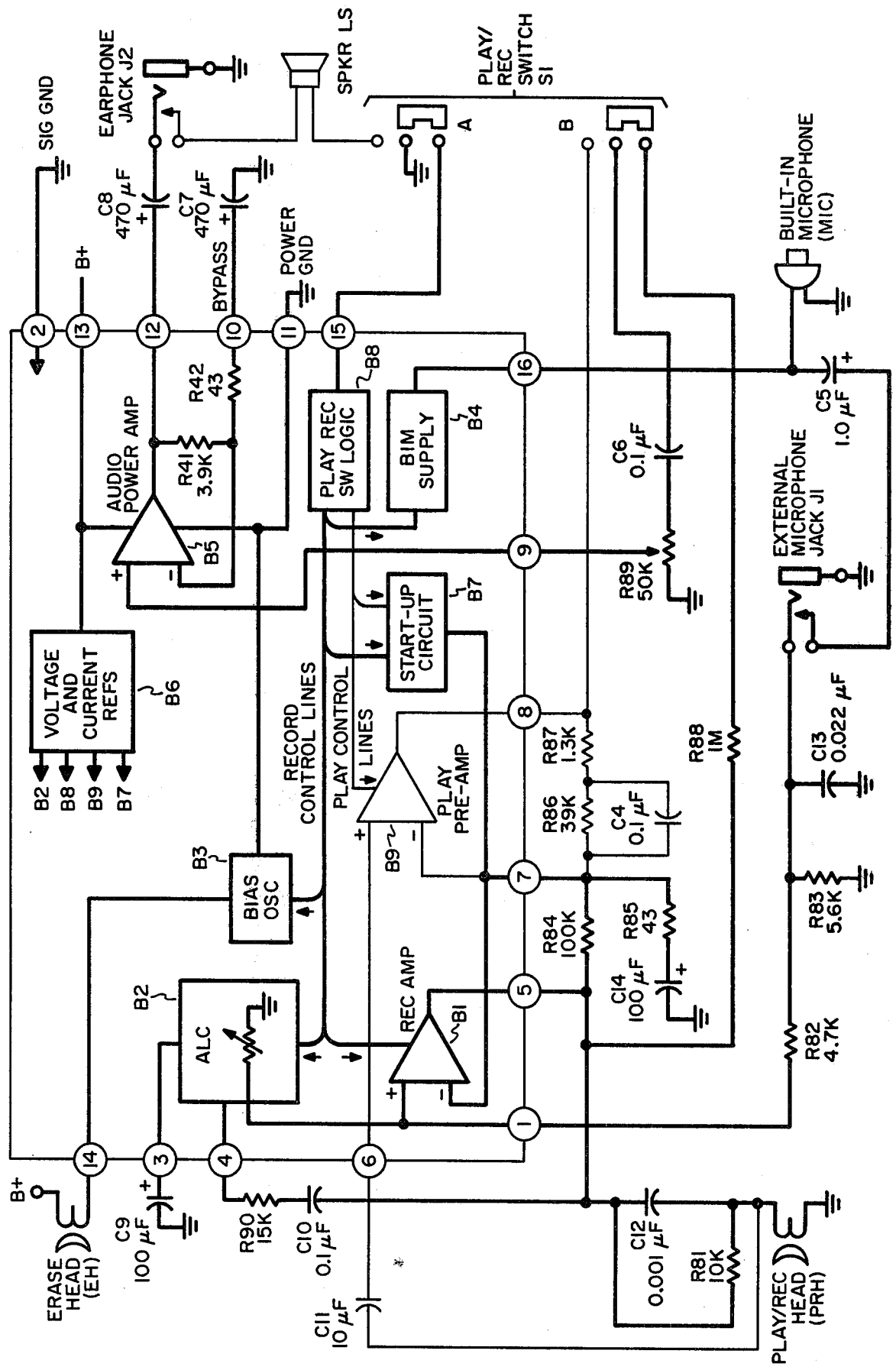
FIG. IA RECORD MODE

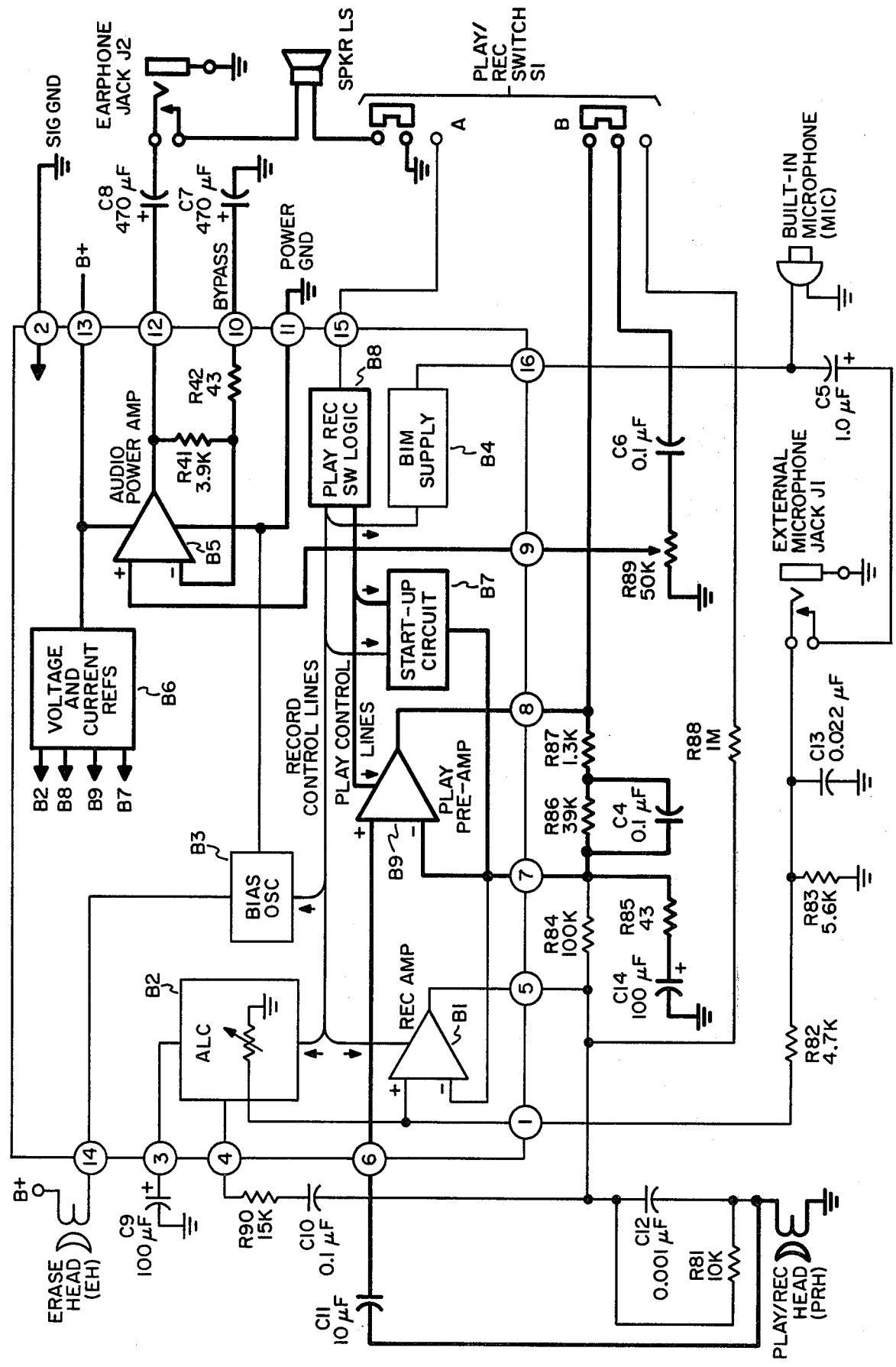
FIG. 1B PLAY MODE

TAPE RECORDER UTILIZING AN INTEGRATED CIRCUIT

BACKGROUND OF THE INVENTION

1. Field of the Invention

The present invention relates to an integrated circuit for use in a tape recorder and to a tape recorder incorporating the integrated circuit. The invention further relates to the means for converting the tape recorder from the recording to the playback mode of operation and to means for insuring temperature stable operation.

2. Description of the Prior Art

The organization of electronic products which were originally designed to be fabricated from discrete electrical components has been very significantly changed with the advent of the integrated circuit. Integrated circuit technology has permitted a very significant growth in electronic circuit complexity on the integrated circuit at a very small incremental cost. By comparison, the cost of adding connections to the integrated circuit has remained high and the costs of "outboarded" or non-integrated electrical components has remained high. Ideally, the product when integrated will have all of the functions of a non-integrated product costing substantially more.

As applied to a tape recorder, it is desirable that the tape recorder have all of the essential functions for recording and playback and that the active electronics for all of these functions be integrated. In the recording mode, for instance, an amplifier is required for recording, and an automatic level control should be provided to standardize the signal level. In addition, a microphone power supply and biasing means for the erase head are normally required. In the playback mode, it is desirable to have an amplifier which operates with the playback head output and which may be used for reproducing the signal. In general, these functions should be provided in a manner which minimizes the external pin count required by the integrated circuit and which permits optimum use of the essential outboarded electrical components. For instance, in previous discrete recorder designs, a single amplifier was generally used for both playback pre-amplification and recording. The choice required complicated mechanical play/record mode switching. Using integrated circuit technology, the cost of separate amplifiers is not prohibitive. When separate amplifiers are used, the switching requirement may be simplified. When much of the switching can be done internal to the integrated circuit, even further simplification in the external switching requirement may be achieved.

SUMMARY OF THE INVENTION

Accordingly, it is an object of the invention to provide an improved integrated circuit for use in a tape recorder.

It is another object of the invention to provide an improved integrated circuit for achieving both play and record mode operation of a tape recorder.

It is still another object of the invention to provide an integrated circuit having improved mode control means.

It is still another object of the invention to provide an integrated circuit for record or play mode operation having improved temperature stability.

It is another object of the invention to provide an improved substantially fully integrated tape recorder.

It is still another object of the invention to provide a substantially fully integrated tape recorder which has improved mode control means.

These and other objects of the invention are achieved in a novel integrated circuit for use in a tape recorder functioning in a recording or playback mode. The integrated circuit includes a first amplifying means, activatable upon the supply of current therein for amplifying an audio signal available from a microphone to a level suitable for connection to a recording head and a second amplifying means, also activatable upon the supply of current thereto for amplifying an audio signal available from a playback head to a level suitable for operating a power amplifier.

The integrated circuit further includes a first current mirror including a first current reference and a first current source referenced to it, which output is used to activate the first amplifying means and a second current mirror including a second current reference and a second current source referenced to it, whose output is used to activate the first amplifying means and a second current mirror including a second current reference and a second current source referenced to it, whose output is used to activate the second amplifying means. A first differentially connected transistor pair is provided, the collector of a first transistor of the pair being serially connected via the first current reference to a source of positive bias potentials and the collector of the second transistor of the pair being similarly connected via the second current reference to the positive bias terminal. A third, current sink transistor is provided, connected to supply emitter current to the differential transistor pair and having a current setting resistance in the path connecting the emitter to the common source terminal. Means are then provided for applying a temperature compensated voltage across the current setting resistance, so as to temperature compensate the current in the current references and in the current sources referenced thereto. A control terminal is provided which controls the interbase of the transistor pair to select which transistor of the pair is conductive and thereby whether the tape recorder is in the recording or playback mode.

In accordance with a further aspect of the invention, the temperature compensated voltage is provided by a band gap voltage reference coupled through an emitter follower transistor of complementary type to the current sink transistor for approximate cancellation of the temperature-induced drift in the junction voltage drop, the connection retaining temperature stability in the voltage appearing across the current-setting resistance in the current sink.

In accordance with a further aspect of the invention, the first and second amplifying means each have non-inverting input terminals for the application of input signals and inverting input terminals for connection to a feedback network. The inverting input terminals are connected together permitting shared use of a resistor and capacitor connected between the inverting input terminals and the common source terminal in the feedback networks of each amplifying means. Means are also provided for rapidly charging this common capacitor, which by connection to the common inverting terminals of the amplification means, permits the addition of this function without adding another pin to the package.

In accordance with another aspect of the invention, the integrated circuit is provided with automatic level control means activatable together with a recording amplifier and deriving an internal standard referenced via a diode junction drop to the band gap reference referred to earlier. The integrated circuit further includes means for supplying current to an erase head and current referenced to the first current mirror, and thereby actuatable when the integrated circuit is in the record mode.

Record or play mode control is preferably achieved by means of a further control transistor whose collector is connected to one base of the first differentially connected transistor pair, with the emitter connected to ground through a tapped resistance and the base connected to the current setting resistance. With a suitable emitter resistance, one or the other transistor of the first differential pair may be turned on depending on whether the tap is connected to the common source terminal (ground), or is left open.

In accordance with a further aspect of the invention, a third "power" amplifying means is provided for driving the sound reproduction means. The third amplifying means is connected to the B+ source and is not subject to mode control. The third amplifying means may be used in the record mode for monitoring, where an earphone is operated; in the playback mode, where a loudspeaker is operatted; or in a radio receiver mode, where a signal is supplied from a radio receiver and a loudspeaker is operated, and the other two amplifying means are inoperative.

The complete tape recorder, which utilizes the integrated circuit, is readily switched from a play to record mode by a single switch. Electrically, it is a two section, single pole, double throw switch. One section of the switch is used to control the mode of the integrated circuit and operation of a loudspeaker. The other section of the switch is used to switch the outputs of the recording and playback amplifiers via a common voltage control to the third amplifier. If a further diode and series resistance is provide connected between the emitter of the control transistor and the emitter of the current sink transistor, a small positive voltage may be used to inactivate both the record and playback for use in the radio reception mode.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawins in which:

FIGS. 1A and 1B show a novel integrated tape recorder system. The drawings show the functional blocks of an integrated circuit containing the principal active circuitry and the external components necessary to complete the system. Double weight lines in FIG. 1A denote those parts of the system which are active in the record mode. Double weight lines in FIG. 1B denote those parts of the system which are active in the playback mode.

DESCRIPTION OF THE PREFERRED EMBODIMENTS

Figure 2A:
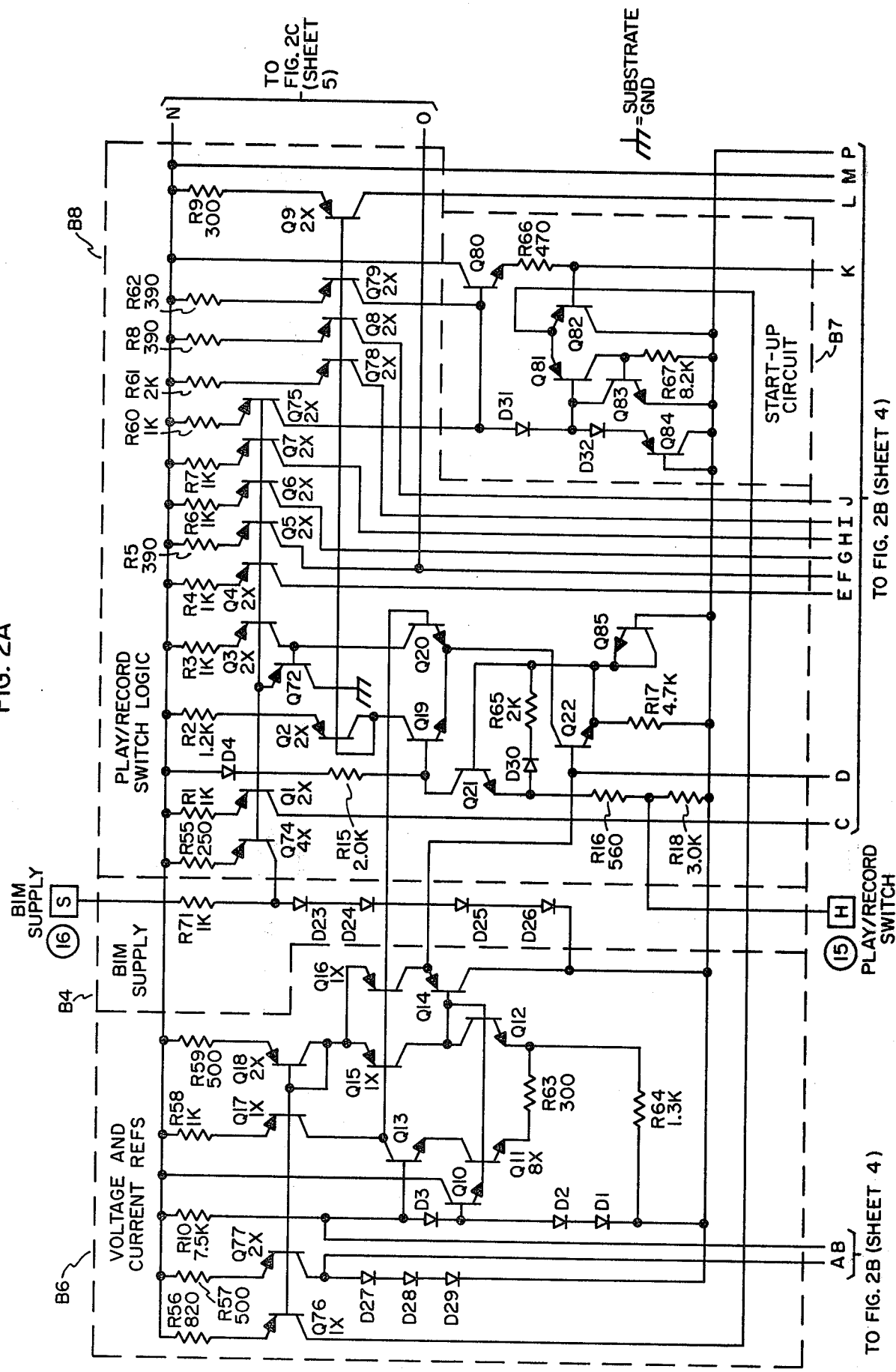
FIGS. 2A, 2B and 2C are continuations of a single electrical circuit diagram of the integrated circuit embodying the invention. These figures illustrate the integrated circuit, with dotted outlines showing the functional blocks into which the circuit elements fall. The connections made to the pins on the integrated circuit package are also shown.

Referring now to the figures, a substantially fully integrated tape recorder system is disclosed. In FIGS. 1A and 1B, the integrated circuit, which contains all of the active circuit elements (transistors and diodes) and many of the passive circuit elements for a tape recorder system, is shown in a block diagram format in association with the outboarded elements which complete the system. The blocks of the integrated circuit are numbered B1 to B9 and correspond to pluralities of circuit elements on the integrated circuit, collected into functional units. (The circuit elements making up the integrated circuit and their interconnections are illustrated in FIG. 2.) The blocks are shown drawn within a rectangular outline while the circled numbers 1–16, drawn on the outline, indicate the pins on the integrated circuit package. FIGS. 1A and 1B, in showing the internal blocks and the external components, show connections between blocks and the external components, show connections between blocks and the connections from the chip to the external components. Economically, the system requires only 16 pins.

FIGS. 1A and 1B show common subject matter, with double weight lines showing those blocks and circuit elements which are active in the recording mode (FIG. 1A) and those blocks are circuit elements which are active in the play mode (FIG. 1B). The blocks of FIG. 1A and FIG. 1B, which are used only in the record mode of the recorder system, include a recording amplifier B1, an automatic level control B2 for the recording amplifier, a bias oscillator/current source B3 for use in erasing and recording, and a built-in microphone power supply B4. The blocks which operate in both the record and the play mode, include an audio power amplifier B5, voltage and current references B6, a start-up circuit B7 for the recording amplifier B1 and play pre-amplifier B9, and the play/record switching logic B8. The block diagrams are completed by the play pre-amplifier B9 which operates only in the play mode.

The outboarded circuit elements (which are coupled to the "numbered" pins on the integrated circuit package, and via "flying leads" in the integrated circuit package to the "lettered" pads on the integrated circuit) include the erase head (EH), the play record head (PRH), the built-in microphone (MIC), the external microphone jack J1, the earphone jack J2, the loudspeaker LS, the play-record mode switch S1, the volume control (R89), and the necessary resistors (R81–R88, R90) and capacitors (C4–C14) used for sundry purposes. Not shown, but a conventional part of the tape recorder system, is the on-off switch inserted between the integrated circuit B+ connection (pin 13) and power supply, the ac power supply itself, and the mechanical provisions for driving the tape and for bringing the erase head (EH) and play/record head (PRH) into contact with the tape.

As noted, FIGS. 1A and 1B illustrate the tape recorder in the record and playback mode, respectively. In the record mode, all blocks are active except for the pre-amplifier (B9), and all outboarded circuit elements are active except for capacitor C11, the speaker (LS) and the circuit elements R86, R87, C4. In the play mode, the active blocks are B5–B9, and the active outboarded circuit elements are capacitors C4, C6, C7, C8, C11 and C14, the resistors R85, R86, R87 and R89 the play/record head (PRH) and the loudspeaker (LS).

The properties of the individual blocks in FIGS. 1A and 1B and their connections will now be discussed. The recording amplifier B1 is a high gain (67 db) wide band (50 Hz to 20 KHz) amplifier, which has complementary inputs to which connections are made, and a single output. The recording amplifier is selectively activated in the record mode by its connection to the record control lines at the output of the play/record switching logic B8. The positive phase input connection of the recording amplifier is connected to pin 1 of the integrated circuit, the negative phase input is connected to pin 7 and the amplifier output is connected to pin 5.

A signal to be recorded is coupled via pin 1 to the recording amplifier. It may be derived from the built-in microphone (MIC) or a microphone coupled to the external microphone jack (J1). The microphone jack is a pair of switching contacts designed to open and to break the circuit to the built-in microphone when a microphone is inserted into the jack. Assuming use of the built-in microphone (MIC), the signal to be operated is coupled via the coupling capacitor C5 to the now closed switching contacts on the jack J1, through a network comprising shunt connected capacitor C13, (connected between the signal path and ground), shunt connected resistor R83, and series connected resistor R82 to pin 1, and thence to the positive phase input terminal of the recording amplifier B1. The capacitor C13 provides a high frequency cut-off for signals derived from the microphone. The resistor R83 provides a dc return to ground for the recording amplifier, establishing a finite source impedance. The resistor R82 functions in combination with the automatic level control B2 to control the recording level.

The output of the recording amplifier available at pin 5 is coupled for recording purposes through the parallel RC network R81, C12 used for record equalization to the record/playback head. The gain of the record amplifier (neglecting the presence of the automatic level control) is determined by a degenerative feedback network comprising resistor R84 serially connected between the output of the record amplifier at pin 5 and the negative phase input at pin 7 and a second resistor R85 serially connected with coupling capacitor C14 between pin 7 and ground. R84 and R85 form a voltage divider in the degenerative feedback network and set the gain at approximately the ratio of the two resistors (100K/43) approx. 2300.

The automatic level control B2 controls the record level of the recording amplifier B1. The automatic level control is a fast attack, slow release circuit, which has an external input connection to pin 4 to which the output of the recording amplifier from pin 5 is coupled through the series connected (external) capacitor C10 and (external) resistor R90. The automatic level control has an internal output connection to the positive input connection of the recording amplifier B1 and an external connection via pin 3 to the external capacitor C9, which sets the time constant of the automatic level control. The external resistance R90, together with an internal resistance (6.6K ohms) in the ALC form a voltage divider which sets the level of the record amplifier output provided to the ALC circuit.

The automatic level control B2 functions in a manner symbolized by the variable resistance indicated in the drawing. This variable resistance appears as an output of the ALC coupled between the positive phase input of the record amplifier and ground. It appears as a shunt element of a voltage divider of which R82, already referred to, is the other element. The shunt element consists of a saturated transistor (Q33, shown in the FIG. 2B circuit diagram) whose small signal collector to emitter resistance is controlled by base current. The base current of Q33 is in turn determined by the record amplifier output through C10, R90.

The ALC forms a control loop whose output remains relatively constant for input signal variation. Let us assume a signal increasing in amplitude at the microphone input. An increased signal is produced at the recording amplifier output, which in turn increases the base current of Q33. Increased base current produces decreased saturation resistance, which by increasing the attenuation of the voltage divider, tends to restore the amplitude of the recording amplifier output close to its previous value.

In the record mode, the output of the record amplifier B1 may be monitored by means driven by the audio power amplifier B5. The B1 output appearing at pin 5 is coupled via series connected 1 megohm resistance R88 to the lowermost stationary contact in the B section of the double pole, double throw mode selection switch S1. A sliding contact, also in the B section of the switch, when slid to the record position, couples the signal to the central stationary contact. From that contact, the capacitor C6 couples the record signal to one end terminal of the 50K ohm potentiometer R89. The remote terminal of the potentiometer is connected to the ground. The tap on the potentiometer R89 is connected to pin 9 at the input to the audio power amplifier B5 on the integrated circuit. The resistance R88, R89 forms a voltage divider having a large step-down ratio (20:1 at maximum volume). If one varies the setting of the potentiometer R89, the volume of the signal coupled to the input of the power amplifier, and the signal level is any monitoring means is also varied. Prior to further treatment of monitoring operation, the power amplifier will be discussed generally.

The power amplifier B5 is a moderately high gain (38 db) wide band (50 Hz to 200 KHz) amplifier which has complementary inputs to which connections are made and a single output producing sufficient power (approximately 1 watt) to drive a loudspeaker. The power amplifier B5 is not in itself the subject of the present application. It is the subject of U.S. Pat. No. 4,025,871 to Peil.

The amplifier B5 is connected to the internal B+ bus, which is connected to pin 13, and to a separate power ground bus, which is coupled to pin 11. (The power ground bus provides isolation from the "signal" ground bus connected to pin 2.) The positive phase input of the audio power amplifier is connected (via pin 9) to the tap on the external potentiometer R89. The output of the power amplifier B5 is coupled via pin 12, and external capacitor C8 to the central terminal of the earphone jack J2, the outer jack terminal being connected to ground. The jack J2 is similar to jack J1 in that the central terminal bears a displaceable contact, which is one of a pair of switching contacts designed to open and disconnect any load connected to the other switching contact when a plug is inserted. The other switching contact of the jack is connected to one terminal of the loudspeaker (LS). The other terminal of the loudspeaker is led to the upper stationary contact on the A section of the mode selection switch S1. In the record mode, the upper stationary contact of the mode selection switch is not further connected, and the speaker is left open-circuited. Should one insert an earphone into the jack J2, the switching contacts to the other loudspeaker terminal is opened (to no further effect in the record mode) and the earphone would become operative.

The gain of the power amplifier is established by a degenerative feedback network which utilizes internal components requiring only one external component, capacitor (C7). The negative phase input of the power amplifier is connected through an internal resistance R42 to pin 10 to which the external capacitor C7 is connected. A second internal resistance R41 is connected between the output of the audio power amplifier and the negative phase input connection. The ratio of the resistances R41 and R42 sets the gain of the power amplifier.

The circuit elements active in the record mode and ancillary to the signal handling just described include the erase head EH, the bias oscillator B3 for operation the erase head, the power supply B4 for the built-in microphone, the voltage and current reference B6, the start-up circuit B7, and the play/record switching logic B8.

Figure 2B:
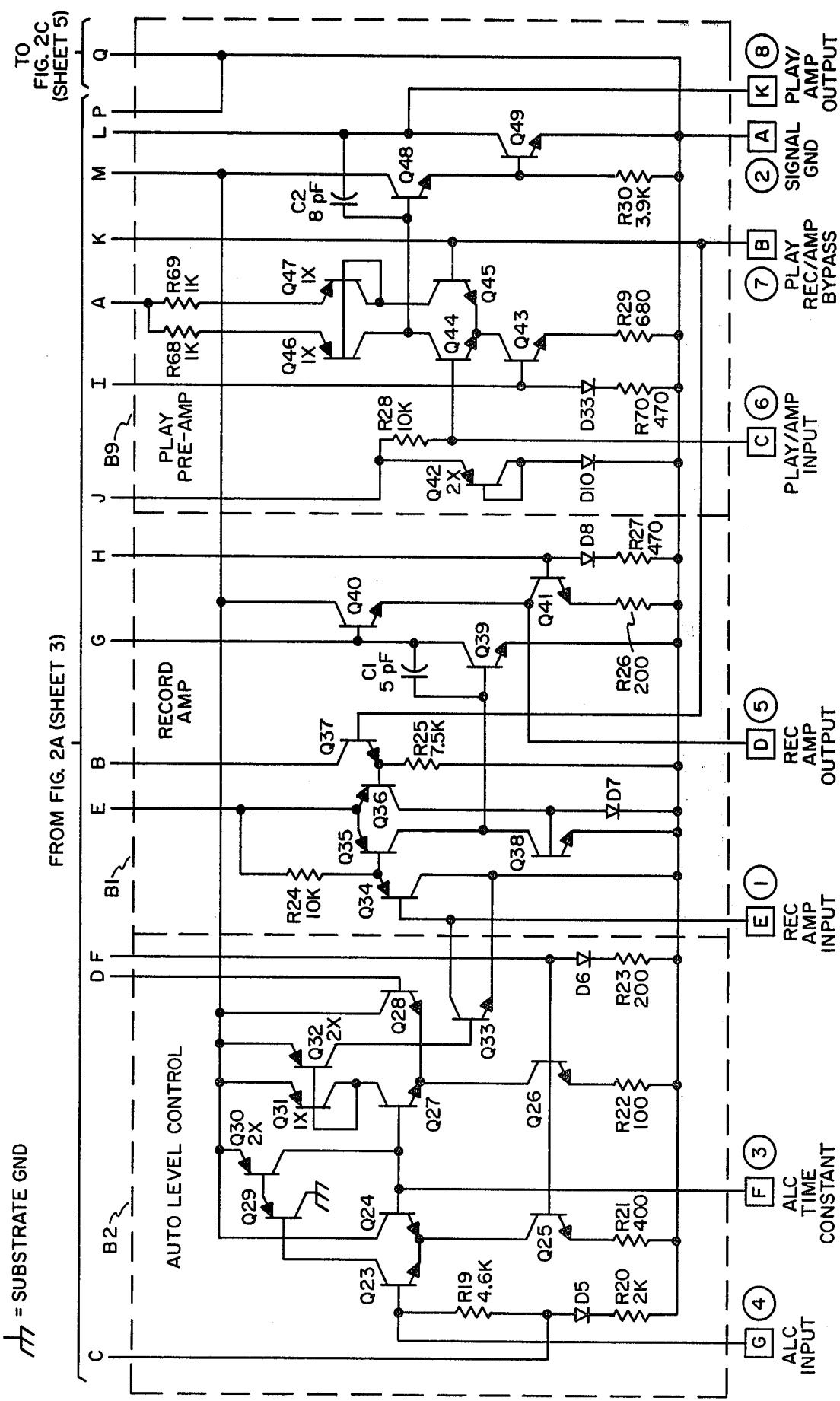
Figure 2C:
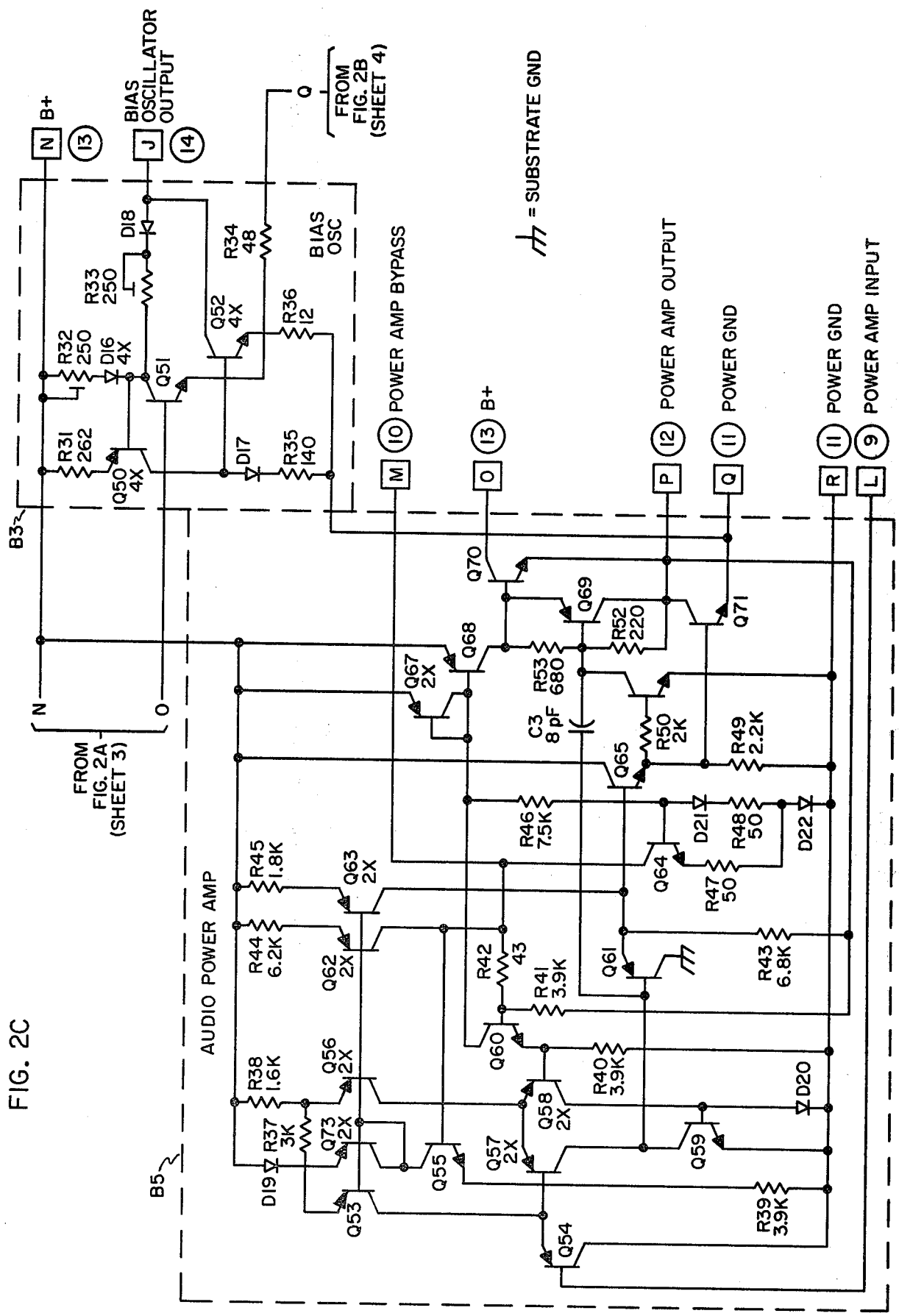

The bias oscillator B3, whose circuit diagram is shown in FIG. 2C, is operated (in the illustrated embodiment) as a non-oscillatory dc current sink connected in series with the erase head across the dc supply for the tape recorder system. The bias oscillator/current sink B3 is not itself the subject of the present application. It is the subject of co-pending U.S. application of Glenn Gawler entitled "Negative Resistance Oscillator Suited for Partial Integration", Ser. No. 242,368, filed Mar. 10, 1981. The bias oscillator has one terminal which is connected to the power ground, leading to pin 11 and another terminal connected to pin 14 which is in turn connected through erase head EH to the B+ terminal of a dc supply for the tape recorder. The choice of the impedance of the erase head precludes oscillatory operation and permits controlled dc current flow into the erase path from the dc supply. A sufficiently high series resistance (and associated offset voltage) assures that the circuit will latch up outside of the negative conductance region and preclude oscillation. The bias oscillator current sink is connected to one of the record control lines at the output of the play record switching logic B8. This connection turns on the bias oscillator current sink in the record mode and turns it off in the play mode.

The built-in microphone supply B7 is connected to supply a controlled current of 1 milliampere at several volts to pin 16 to which one terminal of the built-in microphone is connected. As best illustrated in FIG. 2A, the built-in microphone supply consists of a resistance R11, serially connected between the pin 16 and the collector of a current source transistor Q7, itself a part of the play/record switching logic. The load for the current source is a series string of four diodes D23–D26. The output of the microphone supply should be sufficiently filtered to avoid the coupling of hum into the record amplifier. Additional filtering beyond that provided by the action of the current sources may be obtained by inserting an additional RC network between the microphone and pin 16.

The block B6 is a collection of current and voltage references energized by internal connection to the B+ bus and connected in turn to the blocks B2, B8, B9 and B7. The circuit diagram of B6 showing the individual circuit components and the internal connections to other blocks are shown in FIGS. 2A, 2B and 2C. Commencing at the upper left corner of FIG. 2A, the transistor Q76 and emitter connected resistance R56 provide current to the start-up circuit B7 by a connection made to the emitters of transistors Q81, Q82 in B7. The current established in Q76 is established by the diode connected transistor Q18 whose collector-base is connected to the base of Q76 and whose emitter is connected through resistance R59 to the B+ bus.

A reference voltage from B6 for the play preamplifier B9 is provided by the transistor Q77 whose emitter is connected through resistance R57 to the B+ bus and whose collector is connected to ground through three series connected diodes D27, D28, D29. The reference voltage, which appears at the collector of Q77 is applied to the interconnection of the emitter resistances R68, R69 of transistors Q46, Q47 in play-preamplifier B9.

A reference voltage from B6 for the record amplifier B1 is provided by the resistance R10 (7.5K) having one terminal connected to the B+ bus, and the other terminal connected to ground through three series connected diodes D1, D2, D3. The reference voltage is coupled to the collector of Q37 in the record amplifier B.

Finally, B6 provides two voltage references, one of which is temperature stabilized, to the play/record switching logic B8. These voltage references are developed in the circuitry which includes transistors Q10 to Q18. The diode connected transistor Q18 is connected to the base of Q17 and the B+ bus. The emitter of Q17 is connected to the B+ bus through resistance R58, twice that of R59. Since Q18 has twice the area of Q17, a current ratio is established between Q18 and Q17 of 2:1.

Continuing, the collector-base of Q18 is in turn connected to the emitters of current source transistors Q15 and Q16, both of unit area geometry. The bases of Q15, Q16 are connected together and to the collector of Q17. The collector of Q15 is connected to the collector-base of diode-connected transistor Q12. The emitter of Q12 is connected to ground through resistance R64. The collector-base of Q12 is also connected to the base of Q14 whose emitter is connected to the collector of Q16 and whose collector is connected to the ground. The transistor Q13 has its base connected to the inter-connection between R10 and the anode of D3 and its emitter connected to the collector of Q11. The collector of Q13 is connected to the bases of Q15, Q16 (and collector of Q17). The transistor Q10 has its base connected to the cathode of D3 and its emitter connected to the base of Q11 and base-collector of Q12. The collector of Q10 is connected to the B+ bus. The emitter of transistor Q11, which is of eight times unit area, is connected via resistor R63 to the emitter of Q12 and thence via resistor R64 to ground.

The foregoing circuit functions in the following manner. The transistors Q11 and Q12 form a band-gap voltage reference circuit stabilized against temperature drift. The transistor Q13 supplies current to Q11 approximately equal to that provided by current source transistors Q15 and Q16 to diode connected transistor Q12 and buffer transistor Q14, respectively. The equality in current between Q11 and Q12 arises from equal division of the double current developed in Q18 between Q15 (which supplies current to Q12) and Q16 (which supplies current to Q14). Transistor Q13, which is biased for near unity current gain, is introduced primarily to reduce the amount of the B+ ripple which would be coupled to the voltage reference (collector-base of Q12) through the collector-base junction of transistor Q11.

The temperature compensation of the reference voltage arises by the following mechanism. The greater emitter area of Q11 decreases the current density in Q11 in relation to that in Q12, producing a greater $V_{be}$ drop in Q12 than in Q11. This results in a temperature dependent voltage across R63 by which the emitters are interconnected. The current through R64, in view of the equal current distribution between Q11, Q12 is twice the differential voltage divided by the resistance of R63.

$$I_{64} = 2 \frac{\Delta V}{R_{63}} \quad (1)$$

Accordingly, a reference voltage is established of approximately 1.2 volts at the base-collector of Q12, which is the sum of the $V_{be}$ voltage of Q12 and the voltage drop in R64, R64 being the resistor through which the emitter currents of Q11 and Q12 flow.

$$V_{ref} = V_{be} + 2 \frac{R_{64}}{R_{63}} \Delta V \quad (2)$$

As is well known, the $V_{be}$ drop of Q12 has a negative temperature coefficient and the drop across R14 has a positive temperature coefficient. With suitably selected resistance values and junction areas, the voltage appearing at the collector-base of Q12 may be made substantially independent of temperature. Transistor Q14 transfers this temperature compensated voltage reference to play/record switch logic B8. Transistor Q14 translates the reference to the base of Q22 (in B8), which restores it to the reference value at the emitter of Q22.

The transistor Q11, Q12 and the associated circuitry form a standard temperature compensated reference voltage largely free of ripple present on the B+ bus. Current is started in the band gap reference circuit by Q10, whose emitter is coupled to the bases of Q11, Q12.

The second voltage reference provided to B8 is derived from the connection made from the bases of Q15, Q16 to the base of Q20 in B8. At this point, a voltage which is approximately equal to 2 $V_{be}$ drops below B+ is derived. That voltage is made up of the $V_{be}$ drop in Q18 and the $V_{be}$ drop in Q15-Q16 (in parallel) and a small voltage drop (approx. 0.1 volts) attributable to the small fixed current flowing through R59.

The play/record switching logic B8, acting in association with the mode selection switch S1, establishes whether the tape recorder system is in the play or record mode as a function of the setting of the play/record switch. B8 is shown in FIG. 1A connected by means of a plurality of record control lines successive to the built-in microphone supply B4, the start-up circuit B7, the bias oscillator B3, the automatic level control B2 and the record amplifier B1. These lines facilitate activity when B8 is in the record mode. For use when the play/record switching logic is in the play mode, play control lines are provided, shown connected with the start-up circuit B7 and the play pre-amplifier B9. Connections between the play record switching logic B8 and the B+ bus are present but not shown in the block diagram.

As best seen in the circuit diagram of FIG. 2A, each control of B8 is a transistor current source whose activation or inactivation is designed to activate or inactivate the circuitry to which it provides current. Those current sources associated with record mode operation have a common base interconnection and those current sources associated with play mode operation have a common base interconnection. These common base busses are activated alternately so that in the record mode only the record current sources are active and so that in the play mode only current sources associated with the play base bus will be active. In short, both groups of current sources will operate alternately, and will never be on at the same time. (When operated with a radio receiver both may be off simultaneously.)

Operator control of the logic B8 is provided by mode selection switch S1, via the connection to pin 15 on the integrated circuit and via external connection to the lowermost stationary contact of the A section of the switch. As illustrated in FIG. 1A, the record control lines are active when pin 15 is connected via the movable contact to the stationary central contact of the A section of the switch, which contact is grounded.

The circuit diagram of B8 is provided in FIG. 2A and the interconnections to the blocks are shown generally in FIGS. 2A, 2B and 2C. The play record switching logic (B8) comprises a first collection of transistor current sources active in the record mode and each consisting of a PNP transistor (Q74, Q1, Q4, Q5, Q6, Q7, Q75), each having the emitter thereof connected to the B+ bus through a resistance (respectively, R55, R1, R4, R5, R6, R7, R60). Each current source is designed to set up a current in a load connected to the collector of each transistor, the current being a function of the area of the transistor (4x, 2x, etc.) and of the value of the emitter connected resistance (250, 1K, 1.2K, 390, etc.). Each of the bases of the last recited transistors is connected to a common record bus subject to the immediate control of the transistor pair Q3, Q72, conductive subject to the state of the differential pair Q19, Q20 (which member of Q19, Q20 is conductive) which is set at a standard, temperature stable current established in B6.

The play/record switching logic includes a second collection of transistor current sources (also mentioned above) active in the play mode and each consisting a a PNP transistor (Q78, Q8, Q79, Q9), each connected to the B+ bus through an emitter resistance (respectively, R61, R8, R62, R9). Each of the bases of the last recited transistors is connected together on a common play base bus subject to the immediate control of the diode connected transistor Q2 which is conductive or non-conductive subject to the state of the differential pair Q19, Q20 and is set at a standard, temperature stable current established in B6.

Recapitulating the position of the A section of switch S1 determines which member of the differential PNP transistor pair Q19, Q20 is conductive and thereby whether the record or play base bus is active. The level of the current in the differential pair Q19, Q20 is primarily established in the emitter circuit; the active state of the differential pair is controlled by the base circuit; and the control, which is exerted over the respective base busses, occurs in the collector circuit.

The emitter circuit of Q19, Q20 will be taken up initially. The emitters of differential pair Q19, Q20 are connected together and to a path leading to ground via Q22 and R17. The emitters of Q19, Q20 are connected to the collector of Q22, the base of which is connected to the emitter of Q14 from which the temperature controlled voltage reference from B6 is obtained. The emitter of Q22 is connected to ground through a large current setting emitter resistance R17. As previously explained, the emitter of Q22 is maintained at the reference voltage derived from B6 and the reference voltage acting in concert with R17 establishes the current setting in Q19 and Q20. By virtue of other connections which will be described, the currents in the current sources connected to the respective base busses are also set in relation to this reference.

The bases of the differential pair Q19, Q20 are connected, respectively, to a control circuit subject to control by the mode selection switch S1 and to a voltage reference. In the control circuit, the base of Q19 is connected to B+ through serially connected resistor R15 and diode D4 and to ground through a circuit involving Q21, R16 and R18. The base of Q19 is connected to the collector of Q21 whose base is connected to the emitter of Q22 (at which the reference voltage from B6 appears). The emitter of Q21 is connected to ground through serially connected resistance R16 of 560 ohms and R18 of 3000 ohms. The interconnection between R16 and R18 is connected to pin 15 and via pin 15 to the A section of mode selection switch S1. The switch grounds the pin 15 in the record mode and leaves pin 15 open or ungrounded in the play mode. The base of Q20 is connected to the collector of Q17 from which the second reference potential from B6 is derived. This second reference potential is set at approximately 2 diode drops below B+. When S1A is in the play mode, and the pin 15 is ungrounded, the control transistor Q21 is at a low level of conduction, turning Q19 on and Q20 off. When S1A is in the record mode, the pin 15 is grounded, the control transistor Q21 is turned on, turning Q19 off and Q20 on.

The collectors of differential pair Q19 and Q20 are connected to control the respective base busses. The collector of Q19, a NPN transistor, is connected to the collector base of diode connected transistor Q2. The collector of Q2 is connected to B+ through resistance R2. The collector-base of Q2 is connected to the play base bus and conducts in response to the state of Q19. Thus, if Q19 is nonconductive, Q2 is nonconductive and transistor current sources Q78, Q8, Q79, and Q9 are turned off. The collector of Q20, an NPN transistor, is connected to the collector of Q3, whose emitter is connected through resistance R4 to the B+ bus and whose base is connected to the record base bus. The collector of Q20 is also connected to the base of PNP transistor Q72 whose collector is returned to the substrate ground and whose emitter is connected to the record base bus. Thus, if Q20 is nonconductive, Q3 is nonconductive, and the transistor current sources Q74, Q1, Q4, Q5, Q6, Q7 and Q75 are turned off. The presence of Q72 is designed to divert the base currents (drawn by the controlled current sources) appearing at the collector of Q3 from the path through Q20 and preclude that current (if not so diverted) from creating an error in the current reference in R3, Q3 in relation to the standard established by R17 and the voltage reference obtained from B6.

Returning now to the base control circuit of Q19, Q20; the state of Q21 causes a variation in potential at the base of Q19 of approximately 1 volt causing either Q19 or Q20 to turn on. When Q21 is at a low conduction state by the open-circuitry of pin 15, the base potential of Q19 is approximately 0.5 volts above the base of Q20, which is held at approximately 2 diode drops below B+ turning Q19 on. When Q21 is turned on by connecting pin 15 to ground, the base of Q19 falls approximately one-half volt below the reference value, turning Q20 on.

The state of Q21 is subject to further optional control when its integrated circuit is used in association with a radio receiver. The diode D30 and R65 are connected respectively between the emitter and base of Q21. In addition, a Zener diode Q85 is inserted between the base of Q21 and ground. In the event that it is desired to inactivate all circuitry connected with the play/record switch logic, a positive potential is applied to pin 15 which initially turns Q21 off, and then as diode D30 conducts in a forward direction (if the external potential exceeds 1.7–1.8 volts), the voltage on the emitter of Q22 climbs reverse biasing the input junction of Q22, shutting down both members of the differential pair. Should the external voltage be excessive, the Zener diode conducts, breaking down at about 7 to 9 volts protecting Q22 from reverse breakdown.

The final block active in the record mode and subject to control by B8 is the start-up circuit B7. The start-up circuit reduces the time required to charge capacitor C14, the latter being connected to pin 7 and to the negative phase inputs of amplifiers B1 and B7. Until capacitor C14 is charged, the associated active amplifier B1 or B7, which share the capacitor, is inoperative. For control purposes, B7 has one connection to a record control line from B8 and one connection to a play control line from B8. The foregoing connections shown in 1B are also shown in the circuit diagram of FIG. 2A.

Considering the detailed circuit of FIG. 2A: the start-up circuit B7 comprises an emitter follower transistor Q80 whose collector is coupled to the B+ bus and whose emitter is coupled via resistance R66 to pin 7 for charging the externally connected capacitor C14. Conduction by Q80 is in turn controlled by connections made to the base thereof. The base of Q80 is connected to current source Q75, R62 on the play base bus and to current source Q79, R62 on the record base bus. If either bus is active, Q80 will be active when the tape system is started up. If neither bus is active, Q80 is inhibited from coming on. (With both base buses inhibited, the audio power amplifier, not as either bus, is operative, and may be used in a radio reception mode with a radio receiver.

The base of Q80 in the start-up circuit (B7) is also associated with a differential amplifier acting as a comparator to turn Q80 off, when C14 has reached full charge. The base of Q80 is connected to ground through series connected diodes D31, D32, Q84, the latter being a diode connected transistor. The base of Q81 of the differential transistor pair Q81, Q82 is connected between diode D31 and D32, while the base of Q8 is connected to the pin 7. Thus, the pair Q81, Q82 act in response to a voltage comparison between a reference voltage developed in diodes D32, Q84, applied to the base of Q81 and the voltage sensed on the capacitor C14 applied to the base of Q82. Continuing, the emitters of the differential transistor pair Q81, Q82 are connected via the always active current source Q76, R56 in reference B6 to the B+ bus. The collector of Q82 is returned to ground, while the collector of Q81 is returned to ground through a load resistor R67 and connected in a hook circuit to the base of Q83, whose collector is returned to the base of Q81. The emitter of Q83 is connected to ground.

Assuming that capacitor C14 is uncharged and that record operation has just been initiated, current source Q75, R60 supplies current to the base of Q80 and to the diode string D31, D32, Q84. Q80 conducts strongly and the charging of C14 commences. The differential pair Q81, Q82 is active with Q82 favored to conduct since its base is near ground, while that of Q81 is two diode drops positive producing a reverse bias on Q81. Thus, transistor Q82 conducts strongly and Q81 is turned off. As the voltage on the base of Q82 rises, more of the current supplied by Q76 is diverted away from Q82 and into Q81. When the voltage across R67 rises to a sufficiently high voltage to turn on Q83 the hook circuit connection between Q81, Q83 operates to turn on Q81, very quickly reducing the voltage at the base of Q81 to near zero and the voltage on the base of Q80 to one diode drop above ground. The drop in potential at the base of Q80 removes the forward bias on Q80, turning it off and it is held off until the circuit is inactivated and restarted.

Typically, the start-up time, which operates with either the record amplifier B1 or the play preamplifier B9 is cut to less than ½ second.

At this point, the effect of the play/record switching logic on each of the blocks in the record mode may be treated. The current source Q74, R55 of B8 establishes current flow in the diode string D23, D24, D25, D26 for actuation of the built-in microphone supply B4. In the event that Q74 is cut off, the voltage at the anode of D23 is near zero and insufficient to activate the microphone connected to pin 16. This precludes the undesired supply of an audio signal to the tape system.

The record amplifier B1 is controlled at three points by the play/record switching logic B8, which inactivate the record amplifier in the play mode or activates it in the record mode. The record amplifier is seen in FIG. 2B as a two (gain) stage dc coupled amplifier comprising the transistors Q34 to Q41 and the associated circuit elements.

The first gain stage of B1 is a differential amplifier comprising a first input stage for the positive phase input coupled to pin 1, which utilizes emitter-follower connected PNP transistor Q34, a second input buffer stage for the negative phase input coupled to pin 7, which utilizes the emitter-follower connected NPN transistor Q37, and a differential amplifier comprising PNP transistors Q35, Q36. A single-ended output is derived from the collector of Q35 by means of the differential-to-single-ended converter Q38, D7 and coupled to the base of Q39 in the second gain stage.

The second gain stage of B1 comprises the NPN transistor Q39 in the emitter-common configuration, (using Q6 as an active load) whose output is coupled to the base of output emitter-follower Q40 (using Q1 as an active load) to the output pin 5.

As earlier noted, the external connection to B1 includes the microphone input, which is coupled to pin 1 at the base of Q34 at the input of the record amplifier, and the automatic level control transistor Q33, which is coupled between the base of Q34 and ground. At the output of the record amplifier a degenerative feedback network is provided which comprises resistance 84 coupled between pin 5 and pin 7 and resistor R85 and C14 coupled between pin 7 to ground. Pin 5 of the record amplifier is also coupled through the network R81, C12 to the play record head.

The three controls applied to the record amplifier B1 are applied via the current source Q4, R4, the current source Q6, R6 and the current source Q7, R7, all subject to control by a common connection to the record base bus. The first current source R4, Q4 supplies current to the emitters of differential pair Q35, Q36 of the record amplifier and as examination of the drawing will show, it also supplies emitter current for the signal buffer Q34. This latter connection provides additional noise immunity over other connections that might have been made. If the current source Q4, R4 is off, all three transistors Q34, Q35 and Q36 are inactive. The second current source Q6, R6 provides an active load for the second amplifier (Q39). If Q6, R6 is active, Q39 is operative. If Q6 is non-conductive, Q39 is inoperative. The third current source Q7, R7 supplies current to current mirror D8, R27–Q41, R26. Q41 forms the dynamic load for the output emitter-follower Q40. As before, if Q7, R7 is non-conductive, the output emitter-follower is inoperative. These three controls permit operation of the record amplifier when it is desired and prohibits operation when it is not desired, effectively preventing the creation of stray signals at all critical points in B1 where a signal might arise.

The automatic level control B2 is controlled at two points by the play/record switching logic B8 which activates the block (B2) in the record mode and inactivates the block (B2) in the play mode. The automatic level control comprises transistors Q23 through Q33 and the associated circuit elements.

The automatic level control comprises three functional elements: a peak detector; a reference amplifier; and a variable resistance element. The peak detector consists of a differential amplifier comprising transistors Q23, Q24. The signal to be recorded is coupled from the record amplifier B1 at pin 5 through serially connected external capacitor C10, R90 via the pin 4 to the base of Q23 of the differential pair. The signal appearing at the collector of Q23 is amplified by Q29, Q30 and coupled back to the base of Q24, to which the external capacitor C9 (which determines the ALC time constant) is connected via pin 3. The base of Q27 at the input to the reference amplifier is also connected to pin 5. In an equilibrium condition for peak detection, Q30 need only supply base currents for Q24 and Q27. Thus, Q23 is held near cut-off with Q24 fully conducting. The capacitor coupled to pin 3 is charged to a level equal to the voltage on the base of Q23 plus a temperature dependent factor (4KT/Q).

Peak detection occurs as follows: When a signal is coupled from pin 4 to the base of Q23, Q23 starts to conduct and the collector current is amplified by Q29, Q30 charges the capacitor C9. The voltage across the capacitor increases until an equilibrium is reached. This equilibrium occurs when the capacitor voltage has a value equal to the peak value of the input signal. This voltage is then coupled to the base of Q27 of the reference amplifier. Should the input signal at the base of Q23 fall below its previous level, Q21 again turns off and the capacitor discharges through the bases of Q24, Q27. The peak detector thus has a first attack time (50 milliseconds) and a slow decay time (5 seconds).

The reference amplifier of B2 comprises the differential amplifier Q27, Q28 with the base of Q27 being connected to the peak detector and the base of Q28 being connected to a reference voltage of approximately 1.8 volts in B6. The voltage difference between the base of Q27 (to which the peak detected signal is applied) is converted to a current appearing in the collector of Q27. This current is mirrored with a gain of two by Q31, Q32 and applied to the base of ALC transistor Q33. The transistor Q33 is the variable resistance element referred to earlier and is connected in shunt between pin 1 and ground at the input to the record amplifier B1 to stabilize the recording level.

One of the two controls applied from B8 to the automatic level control B2 is applied via the current source Q1, R1 to the base input circuit of transistor Q23 of the differential pair. Assuming that Q1 is nonconductive, the base of Q23 is held near ground, cutting off Q23 and inactivating the peak detector. When Q1 is conducting, Q23 is turned on, activating the peak detector.

The second control applied to the automatic level control B2 is applied by current source Q5, R5. The current source Q5, R5 in B8 is connected in B2 to Q25, R21, Q26, R22 and D6, R23. D6 and R23 in B2 establishes current in the current source Q25, Q21, which supplies emitter current to the differential amplifier pair Q23, Q24 of the peak detector. D6 and R23 also establishes current in the current source Q26, R22, which supplies emitter current to the differential pair Q27, Q28 of the reference amplifier. In the event that current source Q5, R5 is inactive, both differential amplifiers are shut down and both portions of the automatic level control are turned off.

As shown in FIG. 2A, current source Q5, R5 is also connected to the base of Q51 of the bias oscillator. If Q5, R5 is inactive, the bias oscillator is also inactive, whether acting in an oscillatory mode or a non-oscillatory mode as a current source.

The foregoing description has been addressed primarily to FIG. 1A which illustrates the integrated circuit operated in the recording mode, with the blocks and external components operating in that mode being shown in double weight lines. FIG. 1B is a second drawing of the same block diagram. It also illustrates by double-weight lines those portions of the system which are active in the play (playback) mode. More particularly, the record amplifier block B1, the automatic level control B2, the bias oscillator B3 and the built-in microphone block are now inoperative and shown in single-weight lines in FIG. 1B. The active blocks in FIG. 1B are the voltage and current reference B6, the audio power amplifier B5, the play/record switching logic B8, the start-up circuit B7 and the play preamplifier B9.

External components which are inoperative in the play mode are those connected to pin 1, pin 3, pin 14 and pin 16. In addition, R84 in the feedback network of the record amplifier connected between pin 5 and pin 1 is inactive. R90, C10 connected between pin 4 and pin 5 and the network C12, R81 connected to pin 5 are also inactive.

External components which are operative in the play mode are the play/record head, capacitor C11 connected to pin 6, the feedback network between pins 7 and 8 of the play preamplifier comprising R86, R87, C4 and C14, R85 at pin 7; the upper two contacts of the B section of the switch S1, including the potentiometer R89 and capacitor C6 connected between pins 8 and 9. The bypass capacitor associated with pin 10; and the capacitor C8, earphone jack J2, loudspeaker LS and upper contacts of the A section of the switch S1, all associated with pin 12.

As an examination of the connections made to the two sections of the switch S1 indicate, in the play mode, the B section of the switch S1 couples the output of the play preamplifier to the input of the audio power amplifier, whose output is then coupled to the loudspeaker via the upper set of contacts of the A section of the switch S1. Not shown, but implicit in the switching operation, is the fact that the ungrounding of the lower terminal of the A section of the switch S1 at pin 15 places the play/record switching logic in the play mode, turning off blocks B1, B2, B3 and B4 as earlier noted.

The manner in which the play preamplifier B9 is controlled by B8 will now be discussed. The play preamplifier B9 is controlled at three points by the play/record switching logic B8 which inactivates the record amplifier in the record mode and activates the play preamplifier in the play mode. The three current sources in B8 which perform this function are Q8, R8, Q78, R61 and Q9, R9, each having their bases connected to the play base bus.

The play preamplifier is a two-stage high gain amplifier, the first stage of which consists of the differential amplifier Q44, Q45 with active loads Q46 and Q47, respectively connected in the collector paths to the source of reference voltage in B6. The input to the playback amplifier is connected via pin 6 from the play/record circuit to the base of Q44. The base of Q45 is the degenerative input point to the amplifier and is coupled via pin 7 to the external degenerative feedback network. The output of Q44, Q45 is buffered by emitter-follower stage Q48 whose output is coupled to the base of common emitter stage Q49, the second stage of the preamplifier. The load of Q49 is current source Q9, R9 forming a dynamic load. The positive phase input to the base of Q44 is referenced through R28 to two diode drops above ground by Q42, D10. The emitters of Q46, Q47 are referenced through R68, R69 to three diode drops above ground in series connected diodes D27, D28, D29 in B6.

The current source Q8, R8 is connected into the base circuit of Q44 and effectively inactivates the input side of the differential amplifier. The base of Q44 is connected through resistance R28 to the current source Q8, R8. When Q8, R8 is inactive the positive voltages in the diode string Q42, D10 collapse and the input section of Q44 is turned off.

The current source Q78, R61 and B8 is coupled to the base of Q43. The base of Q43 is returned to ground through diode D33 and resistance R70. The emitter of Q43 is connected to ground through resistance R29 and the collector of Q43 is connected to the emitter of differential pair Q44, Q45 and supply a current thereto. In the event that Q78 is turned off, Q43 is turned off and no current is supplied to the differential pair Q44, Q45. With Q78, R61 active, Q43 is active and establishes a closely regulated emitter current for Q44, Q45.

Current source Q9, R9 is connected to the collector of Q49 where it acts as a dynamic load therefore. If Q9, R9 is inactive, the output common-emitter stage Q49 is disabled and produces no output. If Q9, R9 is active, the output common-emitter stage is active.

The integrated circuit must be capable of tolerating limitations in the dc supply in respect to regulation and ripple; i.e., the integrated circuit must be designed to provide good power supply rejection. Specifically, those blocks having high gain such as the recording amplifier B1, the play pre-amplifier B9, and the built-in microphone supply B4 must not be subject to significant "hum" leakage into the signal paths, nor should the power supply provide significant signal coupling between blocks. All of the current sources associated with these blocks in the integrated circuit must be referenced to a current with a low ripple (i.e. hum, signal, or noise) content. It is also required that the current sources themselves (those referred to B+) have good ripple rejection. The PNP transistors and associated emitter resistors forming these current sources have the requisite ripple rejection. In the present application, the bandgap regulator (Q11, Q12) driven by a fed-back current mirror is used to generate a reference voltage with a low ripple content. The use of Q13, which removes the full power supply ripple from the collector of Q11, also improves ripple rejection. All the current sources in the integrated circuit are derived from this reference.

It should be noted that voltage reference (B6) may be adjusted over a range of temperature coefficients from slightly negative to slightly positive—but always near zero—as desired. The selection is made in order to control the temperature coefficient of the output of the ALC loop to maintain a constant recording level.

What is claimed as new and desired to be secured by Letters Patent of the United States is:

1. An integrated circuit for use in a tape recorder comprising:
   (1) first and second terminals for connection to a dc source, the second terminal being common,
   (2) first amplifying means activatable upon the supply of current thereto, for recording an audio signal, having
      (a) a first, non-inverting input terminal for connection to a microphone,
      (b) a second, inverting input terminal for connection to a feedback network,
      (c) an output terminal for connection to a recording head, and
      (d) a first control connection means for activating said first amplifying means when current is supplied thereto.
   (3) second amplifying means activatable upon the supply of current thereto, for amplifying an audio signal, having
      (a) a first, non-inverting input terminal for connection to a playback head,
      (b) a second, inverting input terminal for connection to a feedback network,
      (c) an output terminal and
      (d) a second control connection means for activating said second amplifying means when current is supplied thereto.
   (4) a first current mirror including a first current reference and a first current source referenced thereto, both connected to said first source terminal, the output of said first current source being connected to said first control connection means,
   (5) a second current mirror including a second current reference and a second current source referenced thereto, both connected to said first source terminal, the output of said second current source being connected to said second control connection means,
   (6) a first differentially connected transistor pair, each transistor thereof having base, emitter and collector electrodes, the collector of a first transistor of said pair being serially connected via said first current reference to said first source terminal and the collector of a second transistor of said pair being serially connected via said second current reference to said first source terminal,
   (7) a third, current sink transistor having base emitter and collector electrodes, the collector thereof connected to the emitters of said differential transistor pair and the emitter thereof connected to said second source terminal via a first current setting resistor,
   (8) a control terminal for controlling the potential of a base of said transistor pair to select which transistor of said pair is conductive, and thereby whether said first or said second amplifying means is active, and
   (9) means connected to said first and second source terminals for applying a temperature compensated voltage across said current setting resistor for temperature compensating the current in said current references, and said current sources referenced thereto.

2. An integrated circuit as set forth in claim 1 wherein said temperature compensated voltage application means comprises
   (a) a band gap voltage reference including a fourth and fifth transistor both of like conductivity type to said third current sink transistor, said fifth transistor being diode connected, the voltage reference appearing at the collector-base thereof, and
   (b) a sixth transistor connected in an emitter follower configuration for coupling said reference voltage to said current sink transistor, said sixth transistor being of a complementary conductivity type to said current sink transistor for approximate cancellation of the temperature induced drift in the junction voltage drops, for temperature stabilization of the voltage appearing across said current setting resistor.

3. An integrated circuit as set forth in claim 2 wherein said inverting input terminals of said first and said second amplifying means are connected together, permitting use of a shared capacitor and resistor in said feedback networks, connected in the series path between said second inverting input transistor and said second source terminal.

4. An integrated circuit as set forth in claim 3 wherein means are provided for rapidly charging a capacitor connected to said interconnected inverting input terminals when one of said amplifying means is first activated and said capacitor is uncharged, said capacitor charging means comprising:
   (1) current supply means connected to said first source terminal having an output connected to said interconnected inverting input terminals,
   (2) a first control connection to a current source referenced to said first current mirror,
   (3) a second control connection to a current source referenced to said second current mirror,
   said current supply means being activatable by either of said last recited current sources, and
   (4) means for sensing the state of capacitor charge to suspend charging, once charging has occurred.

5. An integrated circuit as set forth in claim 4 wherein an automatic level control means is provided, comprising:
   (a) a peak detector having an input terminal to which the output of said first amplification means is coupled and an output terminal at which the peak detected output appears,
   (b) a reference amplifier comprising a second differentially connected transistor pair, each transistor thereof having base, emitter and collector electrodes (1) a first input connection to the base of a first transistor of said second pair for coupling said peak detected output thereto, (2) a second input connection to the base of the second transistor of said second pair for coupling a standard voltage thereto, and (3) an output connection to a collector of said second pair for deriving an output dependent on the voltage difference between the said bases of said second pair and (c) a variable impedance device connected to the input of said first amplifying means for stabilizing the output thereof, said variable impedance device being connected to said reference amplifier output for variation of the impedance thereof as a function of the output thereof.

6. An integrated circuit as set forth in claim 5 wherein said automatic level control means has a third, control connection means for activating said automatic level control means when current is supplied thereto,
said third, control connection means being connected to a current source referenced to said first current mirror.

7. An integrated circuit as set forth in claim 6 wherein said standard voltage for said automatic level control is referenced to the output potential of said band gap voltage reference, being derived from the emitter of said sixth transistor.

8. An integrated circuit as set forth in claim 6 wherein erase current supply means is provided having (1) a terminal for connection to an erase head, and (2) a fourth, control connection means for activating said erase current supply means when current is supplied thereto, said fourth control connection means being connected to a current source referenced to said first current mirror.

9. An integrated circuit as set forth in claim 8 wherein a microphone power supply means is provided having (1) an output terminal for connection to a microphone, and (2) a fifth, control connection means for activating said microphone supply means when current is supplied thereto, said fifth control connection means being connected to a current source referenced to said first current mirror.

10. An integrated circuit as set forth in claim 9 wherein a ninth transistor is provided of a conductivity type like that of said third current sink transistor, having a base, an emitter and a collector electrode, (a) the base thereof being connected to the emitter of said third, current sink transistor, (b) the emitter thereof being connected to ground through a second, tapped resistor; a control terminal being connected to the tap thereof, and (c) the collector thereof being connected through a third, series connected resistor and to a diode to said first source terminal, and to the base of the second member of said first differential pair, the selective connection of said control terminal to ground causes said ninth transistor to be more conductive, turning said first transistor of said first differential pair on, and activating any current sources referenced to said first current mirror for recording operation while the disconnection of said control terminal from ground causes said ninth transistor to be nearly nonconductive, turning said second transistor of said first differential pair on, and activating any current sources referenced to said second current mirror for play operation.

11. An integrated circuit as set forth in claim 10 wherein
a third amplifying means is provided for amplifying an audio signal having (a) a first, non-inverting input terminal (b) a second, inverting input terminal for connection to a feedback network (c) an output terminal for connection to sound reproduction means, and (d) means connecting said third amplifying means to said first and second source terminals for energization thereof.

12. An integrated circuit as set forth in claim 11 wherein
a diode and a fourth resistor are provided, serially connected between the emitter electrode of said ninth transistor and the interconnection between the base electrode of said ninth transistor and the emitter of said third, current sink transistor, said diode being poled to be nonconductive whenever said ninth transistor is turned on, the application of an adequate positive potential to said control terminal causing turn-off of said ninth transistor and said third, current sink transistor, thereby inactivating current sources associated with both current mirrors and the electronic means activatable with these current sources.

13. An integrated circuit with a minimum terminal pin count on the integrated circuit package per function as set forth in claim 11 wherein:

(1) the inverting input terminals of said first and second amplifying means and the output of said capacitor charging means are connected to a single terminal pin, (2) one terminal of said variable impedance device and the non-inverting input of said first amplifying means are connected to a single terminal pin, the other terminal of said variable impedance device being connected to said second source terminal.

14. An integrated circuit as set forth in claim 1 wherein:

A. said inverting input terminals of said first and second amplifying means are connected together, permitting use of a shared capacitor and resistor in said feedback networks, connected in the series path between said inverting input terminals and said second source terminal, and B. means are provided for rapidly charging a capacitor connected to said interconnected inverting input terminals when one of said amplifying means is first activated and said capacitor is uncharged, said capacitor charging means comprising:

(1) current supply means connected to said first source terminal having an output connected to said interconnected inverting input terminals, (2) a first control connection to a current source referenced to said second current mirror, (3) a second control connection to a current source referenced to said second current mirror, said current supply means being activatable by either of said last recited current sources, and (4) means for sensing the state of capacitor charge to suspend charging, once charging has occurred.

15. An integrated circuit as set forth in claim 14 wherein an automatic level control means is provided comprising:

A. a peak detector having an input terminal to which the output of said first amplification means is coupled and an output terminal at which the peak detected output appears, B. a reference amplifier comprising a second differentially connected transistor pair, each transistor thereof having base, emitter and collector
  (1) a first input connection to the base of a first transistor of said second pair for coupling said peak detected output thereto,
  (2) a second input connection to the base of the second transistor of said second pair for coupling a standard voltage thereto, and
  (3) an output connection to a collector of said second pair for deriving an output dependent on the voltage difference between the said bases of said second pair, and C. a variable impedance device connected to the input of said first amplifying means for stabilizing the output thereof, said variable impedance device being connected to said reference amplifier output for variation of the impedance thereof as a function of the output thereof, and D. a third control means for activating said automatic level control means when current is supplied thereto, said third control connection means being connected to a current source referenced to said first current mirror.

16. An integrated circuit as set forth in claim 15 wherein:

A. erase current supply means is provided having:
  (1) a terminal for connection to an erase head, and
  (2) a fourth, control connection means for activating said erase current supply means when current is supplied thereto, said fourth control connection means being connected to a current source referenced to said first current mirror, and B. a microphone power supply means is provided having:
  (1) an output terminal for connection to a microphone, and
  (2) a fifth, control connection means for activating said microphone supply means when current is supplied thereto, said fifth control connection means being connected to a current source referenced to said current mirror.

17. An integrated circuit as set forth in claim 16 wherein:

a third amplifying means is provided for amplifying an audio signal having
  (a) a first, non-inverting input terminal
  (b) a second, inverting input terminal for connection to a feedback network
  (c) an output terminal for connection to sound reproduction means, and
  (d) means connecting said third amplifying means to said first and second source terminals for energization thereof.

18. A tape recording comprising the integated circuit set forth in claim 17 having in addition thereto:

first switching means having a first contact connected to said control terminal and a second contact connected to said second source terminal, and operable between an open condition for play mode operation and a closed condition for record mode operation.

19. A tape recorder as set forth in claim 17 wherein:

the inverting input terminals of said first and second amplifying means and the output of said capacitor charging means are connected to a common terminal pin, and having in addition thereto a degenerative feedback network comprising a serially connected capacitor and a fifth resistor connected between said last recited terminal pin and said second source terminal.

20. A tape recorder as set forth in claim 17 wherein
(a) a second switching means is provided having a first, a second and a third contact, the second contact being optionally connected to said first or third contact;
(b) the output terminal of said first amplifying means being connected to said first switch contact of said second switching means;
(c) the output terminal of said second amplifying means being connected to said third switch contact of said second switching means; and
(d) a potentiometer is provided connected between said second contact of said second switching means and the first non-inverting input terminal of said third amplifying means, to provide amplitude adjustment of the output of either of the first or second amplifying means coupled to the input of said third amplifying means.

21. A tape recorder as set forth in claim 20 wherein:
(a) sound reproduction means are provided
(b) said first switching means as a first, second and a third contact, the second contact being optionally connected to said first or third contact,
(c) the first contact of said first switching means being connected to said first control terminal, and the second contact of said first switching means being connected to said second source terminal,
(d) said sound reproduction means being connected in a series path between the output terminal of said third amplifying means and said third contact of said first switching means, and
(e) said first switching means and said second switching means are operated together.

* * * * *